(12) United States Patent
Mandelman et al.

(10) Patent No.: US 6,818,528 B2
(45) Date of Patent: Nov. 16, 2004

(54) METHOD FOR MULTI-DEPTH TRENCH ISOLATION

(75) Inventors: Jack A. Mandelman, Stormville, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 10/004,152

(22) Filed: Oct. 24, 2001

(65) Prior Publication Data

US 2003/0077875 A1 Apr. 24, 2003

(51) Int. Cl.[7] .............................................. H01L 21/76
(52) U.S. Cl. ....................................................... 438/427
(58) Field of Search ................................. 438/424, 427, 438/700

(56) References Cited

U.S. PATENT DOCUMENTS

| | | | | |
|---|---|---|---|---|
| 4,495,025 A | * | 1/1985 | Haskell | 438/427 |
| 4,988,639 A | | 1/1991 | Aomura | |
| 5,298,450 A | * | 3/1994 | Verret | 438/427 |
| 5,340,755 A | * | 8/1994 | Zwicknagl et al. | 438/424 |
| 5,536,675 A | * | 7/1996 | Bohr | 438/427 |
| 5,646,063 A | * | 7/1997 | Metha et al. | 438/427 |
| 5,679,599 A | | 10/1997 | Mehta | |
| 5,683,932 A | * | 11/1997 | Bashir et al. | 438/424 |
| 5,817,568 A | * | 10/1998 | Chao | 438/427 |
| 5,888,881 A | | 3/1999 | Jeng et al. | |
| 5,893,744 A | * | 4/1999 | Wang | 438/401 |
| 5,895,253 A | * | 4/1999 | Akram | 438/424 |
| 5,904,540 A | * | 5/1999 | Sheng et al. | 438/427 |
| 5,950,093 A | * | 9/1999 | Wei | 438/401 |
| 6,020,230 A | * | 2/2000 | Wu | 438/222 |
| 6,150,212 A | * | 11/2000 | Divakaruni et al. | 438/244 |
| 6,207,532 B1 | * | 3/2001 | Lin et al. | 438/424 |
| 6,207,534 B1 | * | 3/2001 | Chan et al. | 438/427 |
| 6,258,696 B1 | * | 7/2001 | Lee et al. | 438/424 |
| 6,261,964 B1 | | 7/2001 | Wu et al. | |

* cited by examiner

Primary Examiner—David S. Blum
(74) Attorney, Agent, or Firm—Scully, Scott, Murphy and Presser; Joseph P. Abate

(57) ABSTRACT

A method for forming multi-depth apertures in a substrate is provided. The method includes first providing a pad stack atop a surface of a substrate having regions for forming apertures therein, the pad stack includes at least a top patterned masking layer. Next, at least one of the regions of the substrate is blocked with a first block mask, while leaving at least one other region of the substrate unblocked. A plurality of first apertures having a first depth is then formed in the unblocked region of the substrate using the patterned masking layer to define the plurality of first apertures. The first block mask is then removed; and thereafter a plurality of second apertures having a second depth is formed in regions of the substrate that were previously blocked by the first block mask using the same patterned masking layer to define the second apertures, while simultaneously increasing the first depth such that the first depth is deeper than the second depth.

20 Claims, 8 Drawing Sheets

METHOD FOR MULTI-DEPTH TRENCH ISOLATION

FIELD OF THE INVENTION

The present invention relates to device manufacturing, and more particularly to a method of forming a plurality of apertures in a substrate, with each aperture having a predetermined depth, wherein at least two of the apertures have different depths associated therewith. More specifically, the present invention relates to a method of forming a plurality of trench isolation regions in a semiconductor substrate, with each trench isolation region having a predetermined depth, wherein at least two of the trench isolation regions have different depths associated therewith.

BACKGROUND OF THE INVENTION

The migration to vertical metal oxide semiconductor field effect transistor (MOSFET) cells for dynamic random access memory (DRAM) and embedded dynamic random access memory (eDRAM) has led to the requirement of trench isolation regions in array device areas which are shallower than in the support device areas. The array device areas are those regions of the semiconductor wafer that have devices that benefit from longer channel lengths. Thus, the array device areas typically contain the DRAMs and eDRAMs capacitors (and hence the access transistors to the capacitors). These circuits operate at higher voltages than the supports that generally, but not always, operate at lower voltages and consist of higher performance transistors.

In order to avoid floating well effects, which lead to data retention problems, the array device areas require trench isolation regions which are shallower (on the order of from about 100 to about 150 nm) than what has been customarily practiced in the semiconductor industry. On the other hand, the standard depth (about 250 nm) trench isolation is required in the support device areas to provide adequate isolation between source/drain (S/D) diffusions and adjacent wells. Prior art vertical DRAM cells using shallower isolation trenches in the array device areas generally require an additional critical mask to separately define support device isolation regions.

Examples of prior art that may form isolation regions having different depths include U.S. Pat. No. 4,988,639 to Aomura ("Aomura"), U.S. Pat. No. 5,679,599 to Mehta ("Mehta"), and U.S. Pat. No. 5,888,881 to Jeng, et al. ("Jeng, et al."). These prior art methods are not cost effective since they require additional critical masks and/or use elaborate processing steps for forming isolation regions having varying depths.

Specifically, Aomura discloses a method of manufacturing semiconductor devices that requires the use of a separate critical mask for each isolation depth region desired. The use of a single critical mask to define isolation trenches having different depths is, however, not disclosed in Aomura. In addition to requiring the use of separate critical masks to define the variable depth trench isolation regions, the method disclosed in Aomura suffers from alignment sensitivity between the two isolation regions.

Mehta discloses a method for isolating regions of a circuit device in a semiconductor substrate. Specifically, Mehta discloses a structure having two types of isolation regions; trench isolation having a first depth and recessed local oxidation of silicon (LOCOS) isolation having a shallower second depth. Although openings in a masking layer for all isolation regions are formed simultaneously with a critical mask, a resist placeholder region is needed to protect the shallower isolation while the isolation trenches are etched. A maskless technique is then employed to process the shallow isolation without affecting the depth of the trench isolation.

Jeng, et al. disclose a process for fabricating a recessed field oxide area. The Jeng, et al. patent depends on the trench width to determine the type of isolation, i.e., trench isolation or LOCOS. The Jeng, et al. patent does not specifically disclose the formation of isolation regions of different depth, although that may incidentally occur as a byproduct of the process. The main objective of Jeng et al. is to provide trench isolation regions having either sharp corners and steep sidewalls or rounded silicon corners with sloped sidewalls. The method employed in Jeng, et al. includes a recess etch of the trench fill material of two types of trenches; a narrow first type trench and a wider second type trench, allowing the first fill material to be completely removed from the second type trench. The second type trench is then modified by using a LOCOS technique; while the first type of trench is partially protected from the LOCOS by the remaining first fill material.

In view of the above, there is an increased need for providing a cost effective method of forming a plurality of apertures, such as trench isolation regions, in a substrate, such as a semiconductor substrate, wherein at least two of the apertures have different depths.

SUMMARY OF THE INVENTION

One object of the present invention is to provide a cost effective method for forming a plurality of apertures in a substrate, each aperture having a predetermined depth, wherein at least two of the apertures have different depths associated therewith.

A further object of the present invention is to provide a method which is useful in forming a plurality of trench isolation regions in a semiconductor substrate wherein at least two of the trench isolation regions have different depths associated therewith.

Another object of the present invention is to provide a method of forming a plurality of apertures, such as trench isolation regions, in a substrate wherein the alignment of the apertures is independent of the mask used in forming the same.

In broad terms, the inventive method for forming multi-depth apertures in a substrate comprises the steps of:
(a) providing a pad stack atop a surface of a substrate having regions for forming apertures therein, said pad stack including at least a top patterned masking layer;
(b) blocking at least one of said regions of said substrate with a first block mask, while leaving at least one other region of said substrate unblocked;
(c) forming a plurality of first apertures having a first depth in said unblocked region of said substrate using said patterned masking layer to define said plurality of first apertures;
(d) removing said first block mask; and
(e) forming a plurality of second apertures having a second depth in regions of said substrate that were previously blocked by said first block mask using said patterned masking layer to define said second apertures, while simultaneously increasing said first depth such that said first depth is deeper than said second depth.

In some embodiments of the present invention, a second block mask may be formed on a remaining portion of the regions of the substrate that were blocked by the first block mask prior to conducting step (e). After step (e) is performed, the second block mask is removed and a plurality of third apertures having a third depth are formed in regions of the substrate that were previously blocked by the second block mask using the patterned masking layer to define the third apertures, while simultaneously increasing the depth of both the first and second apertures. In this embodiment of the present invention, the first apertures have a depth greater than the second apertures, which, in turn, have a depth greater than the third apertures.

The above processing of blocking and forming a plurality of apertures may be repeated any number of times so as to provide different sets of apertures in the substrate that have varying depths. It is noted that the apertures formed later in the inventive method will be shallower than the previous formed apertures.

In a preferred embodiment of the present invention, the apertures are trench isolation regions and the substrate is a semiconductor substrate.

DETAILED DESCRIPTION OF THE INVENTION

Figure 1:
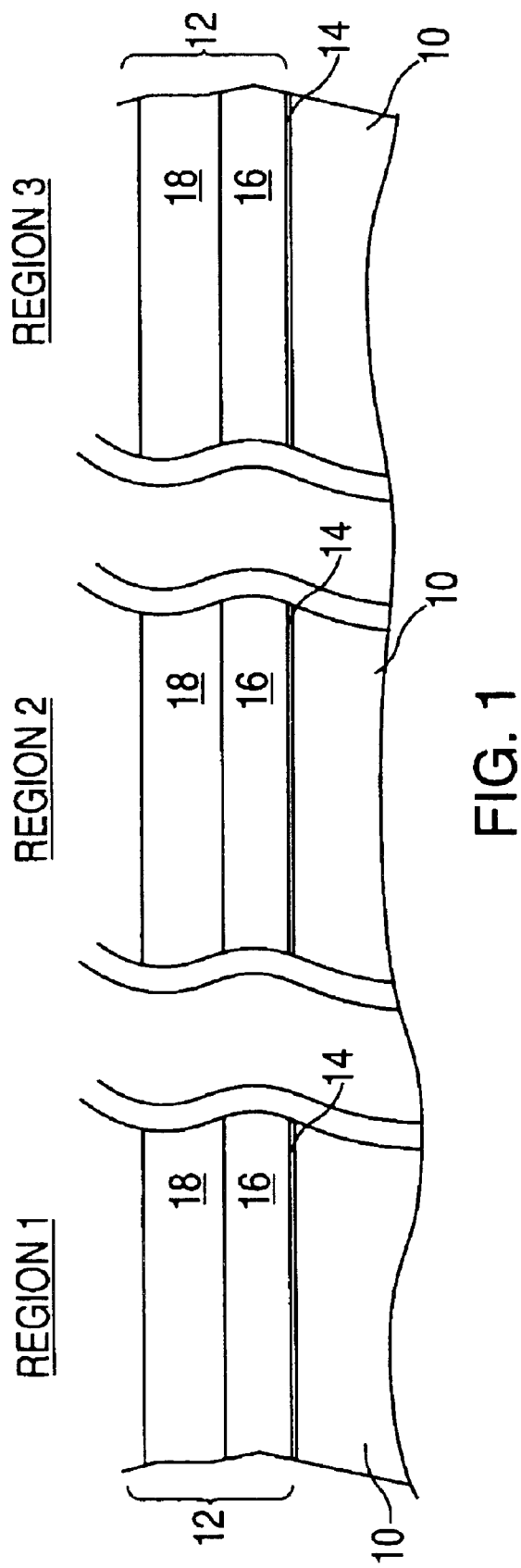
FIGS. 1–8 are pictorial representations (through cross-sectional views) illustrating the various processing steps of the present invention used in forming trench isolation regions having varying depths.

The present invention, which provides a method of forming multi-depth apertures in a substrate, will now be described in greater detail by referring to the drawings that accompany the present application.

Before addressing the drawings in greater detail it is noted that the drawings illustrate a preferred embodiment of the present invention wherein the substrate is a semiconductor substrate and the apertures are trench isolation regions. Although illustration is provided for this preferred embodiment of the present invention, the present invention is not limited solely to that embodiment. Instead, the inventive method works using various types of substrates besides semiconductor structures. For example, the present invention includes, in addition to semiconductor substrates, substrates that are composed of conductors and insulators such as metals, metallic compounds, plastics, films, composites, and laminates. Mixtures and/or multilayers of the various substrates are also contemplated herein.

Also, the term aperture is not limited to trench isolation regions, but instead is used broadly herein to denote any kind of opening, trench, groove, notch, hole, slit, gap, slot, cleft, via, space void, passage or combinations thereof that may be formed into a surface of a substrate.

In regard to the embodiment shown in FIGS. 1–8, the substrate is a semiconductor substrate and the apertures are trenches used in forming trench isolation regions in the substrate. It is noted that in FIGS. 1–8 three regions are depicted wherein three sets of trench isolation regions are formed in the substrate, each set having its own distinct depth. It is noted that FIGS. 1–8 are exemplary and that the present invention works equally well when as few as two sets of trenches are formed in the substrate or when more than three sets of trenches are formed in the substrate.

Reference is first made to FIG. 1 which shows an initial structure that is employed in the present invention. Specifically, the initial structure shown in FIG. 1 comprises semiconductor substrate 10 having pad stack 12 formed thereon. As shown, the pad stack includes various layers such as pad oxide layer 14, pad nitride layer 16 and masking layer 18. The pad stack may include additional material layers besides layers 14 and 16 so long as the top layer of the pad stack is comprised of masking layer 18. The masking layer is employed herein as the single critical mask used in defining each of the trench isolation regions. In some embodiments of the present invention, the pad stack may include only a masking layer. The initial structure also includes, for example, three regions which are labeled as REGION 1, REGION 2 and REGION 3. Each region represents an area of the substrate wherein a plurality of apertures, e.g., trench isolation regions, each having a predetermined depth, will be formed.

The initial structure illustrated in FIG. 1 is comprised of conventional materials well known in the art, and conventional processing steps that are also well known in the art are employed in forming the same. For example, semiconductor substrate 10 comprises any semiconductor material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs), are also contemplated herein.

Pad stack 12 is then formed atop a surface of semiconductor substrate 10 using conventional techniques well known in the art. For instance, pad oxide layer 14 is first formed on a surface of the semiconductor substrate using a conventional deposition process such as chemical vapor deposition (CVD), plasma-assisted CVD, sputtering and chemical solution deposition. Alternatively, pad oxide layer 14 of pad stack 12 may be formed by a thermal oxidation process. The thickness of the pad oxide layer formed at this point of the present invention may vary, but typically, pad oxide layer 14 has a thickness of from about 1 to about 15 nm, with a thickness of from about 3 to about 10 nm being more highly preferred.

Next, pad nitride layer 16 is formed atop pad oxide layer 14 utilizing a conventional deposition process such as CVD, plasma-assisted CVD, sputtering and chemical solution deposition. The pad nitride layer formed in the present invention is generally thicker than the corresponding pad oxide layer. Typically, pad nitride layer 16 has a thickness of from about 50 to about 500 nm, with a thickness of from about 100 to about 250 nm being more highly preferred.

Following the formation of pad nitride layer 16, masking layer 18 is formed atop the pad nitride layer utilizing a conventional deposition process such as CVD, plasma-assisted CVD, sputtering, spin-on coating, and chemical solution deposition. The masking layer employed in the present invention may be comprised of a silicate glass such as boron doped phosphorus silicate glass (BPSG), tetraethylorthosilicate (TEOS) or any other like material which can serve as a hardmask. Of these materials, it is preferred to use BPSG as the masking layer in the embodiment illustrated herein. It is again noted that the masking layer employed in the present invention will subsequently be used as a single critical masking layer to define the areas in the substrate wherein the various apertures will be formed.

The thickness of the masking layer may vary depending on the composition of the same as well as the process that is employed in applying the masking layer to the pad nitride layer. Typically, however, masking layer 18 has a thickness of from about 100 to about 1000 nm, with a thickness of from about 200 to about 500 nm being more highly preferred.

Figure 2:
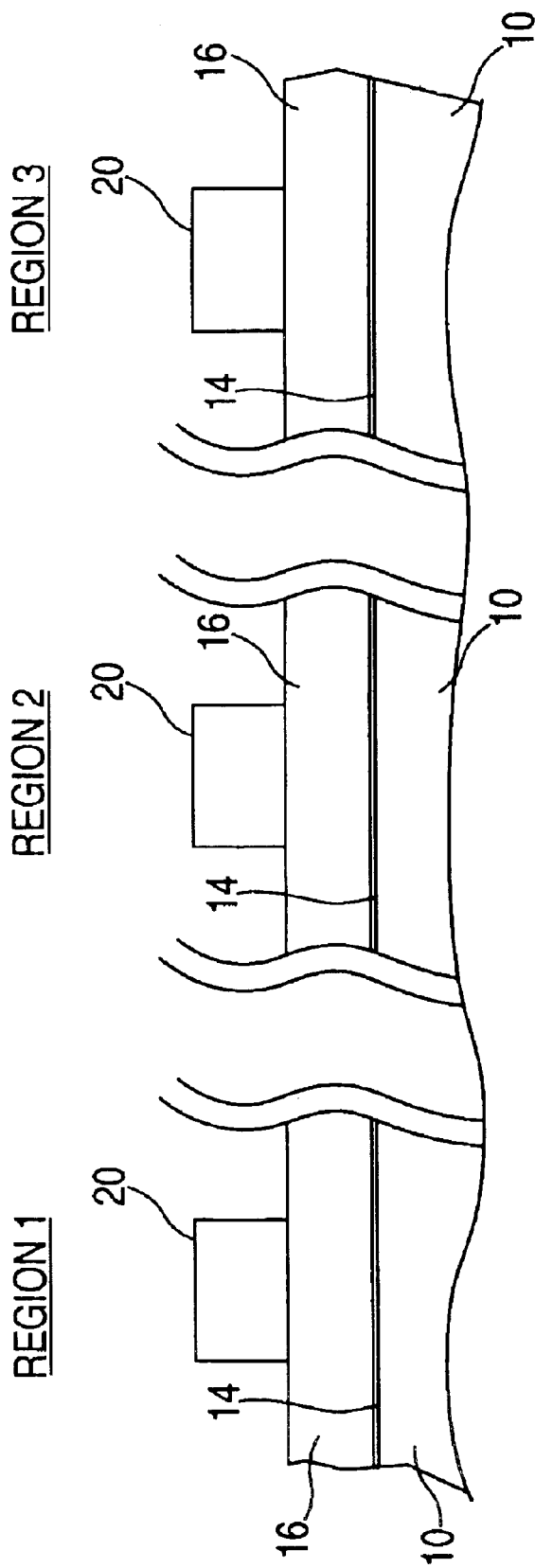

Next, masking layer 18 is patterned using lithography and etching so as to form the structure shown in FIG. 2. Specifically, patterned masking layer 20 is formed by first applying a photoresist (not shown) to the top surface of masking layer 18, exposing the photoresist to a pattern of radiation and then developing the pattern into the photoresist using a conventional developer. With the patterned photoresist in place, the pattern is transferred to masking layer 18 using a conventional dry etching process that is selective to nitride. Illustrative examples of suitable dry etching processes that may be employed in forming patterned masking layer (i.e., hardmask) 20 include, but are not limited to: reactive ion etching (RIE), ion beam etching, plasma etching or laser ablation. Note that this etching step forms a critical hardmask on the structure which defines the active areas wherein etching of the apertures will not occur. Following the etching process, the photoresist is removed providing the structure shown in FIG. 2.

Figure 3:
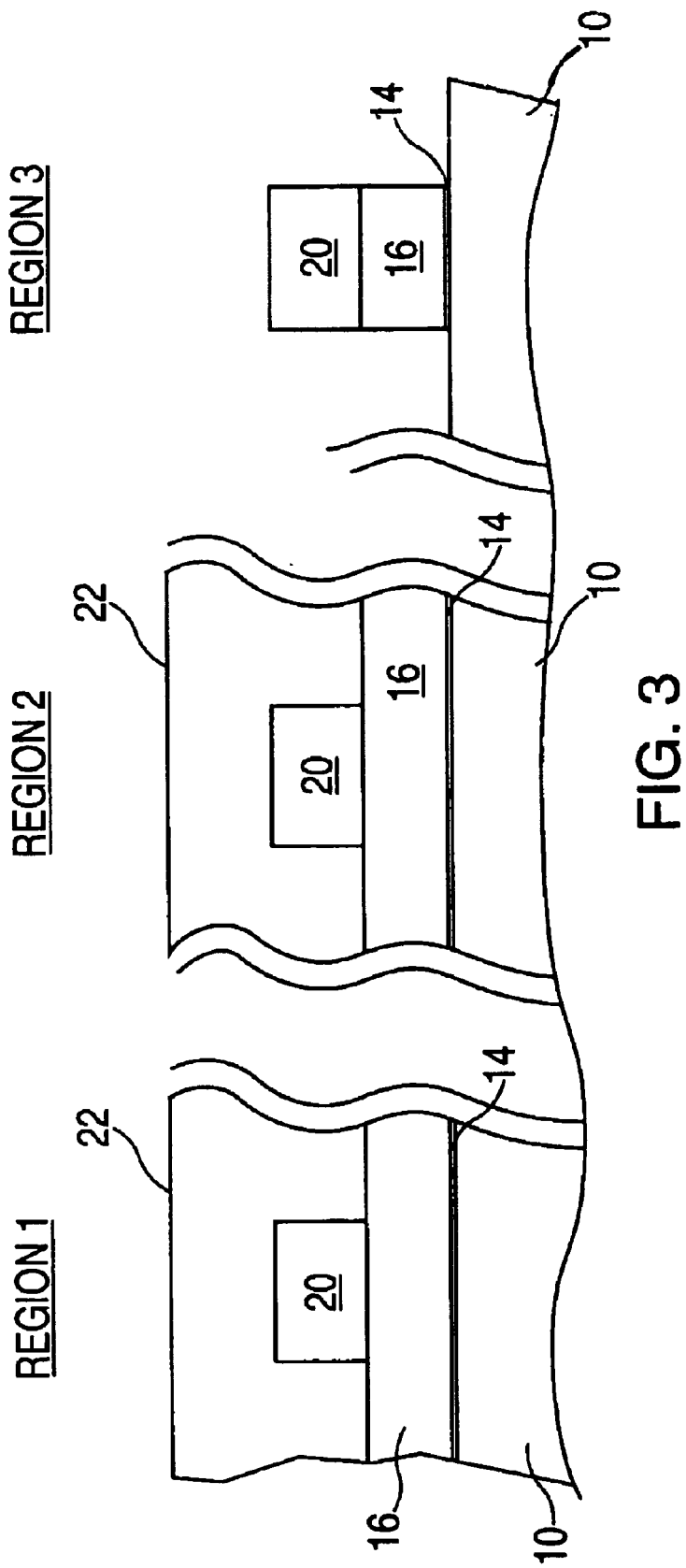
Figure 4:
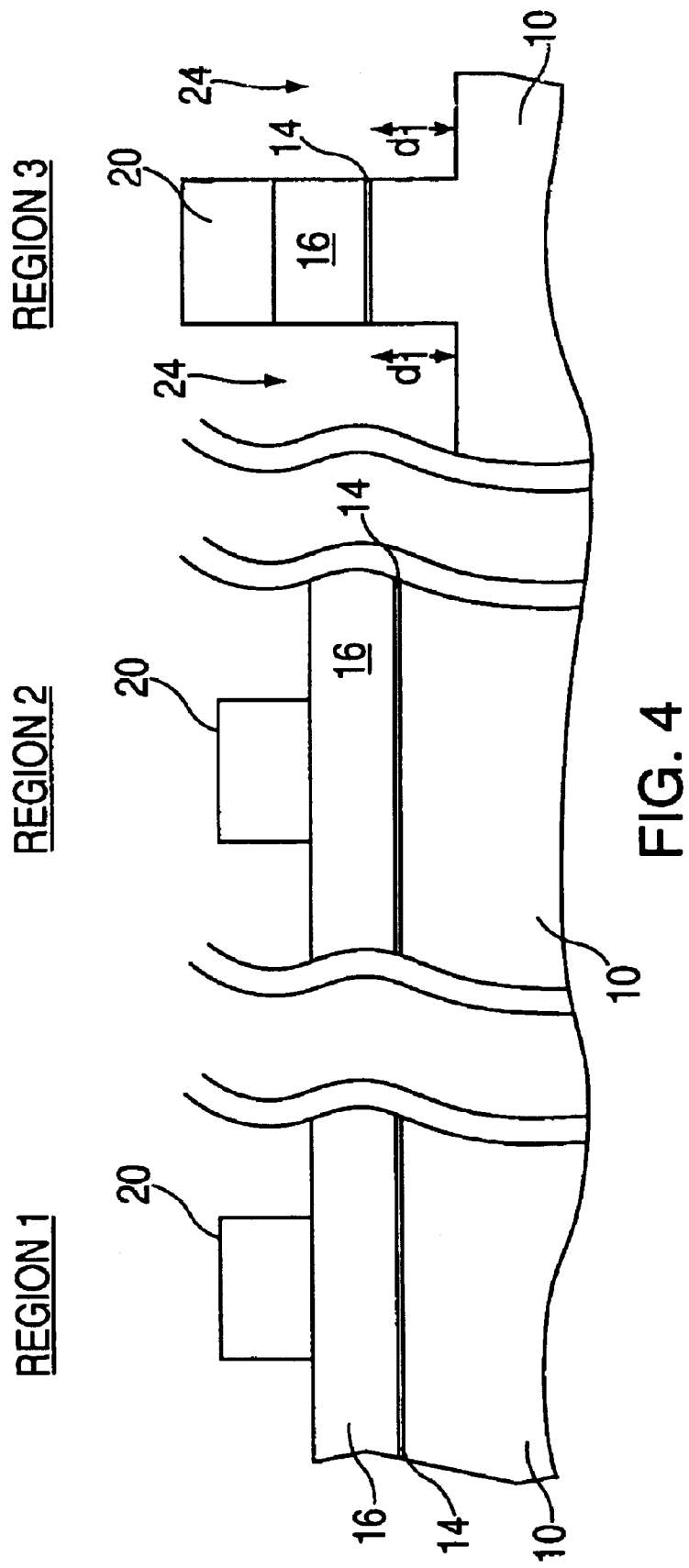
Figure 5:
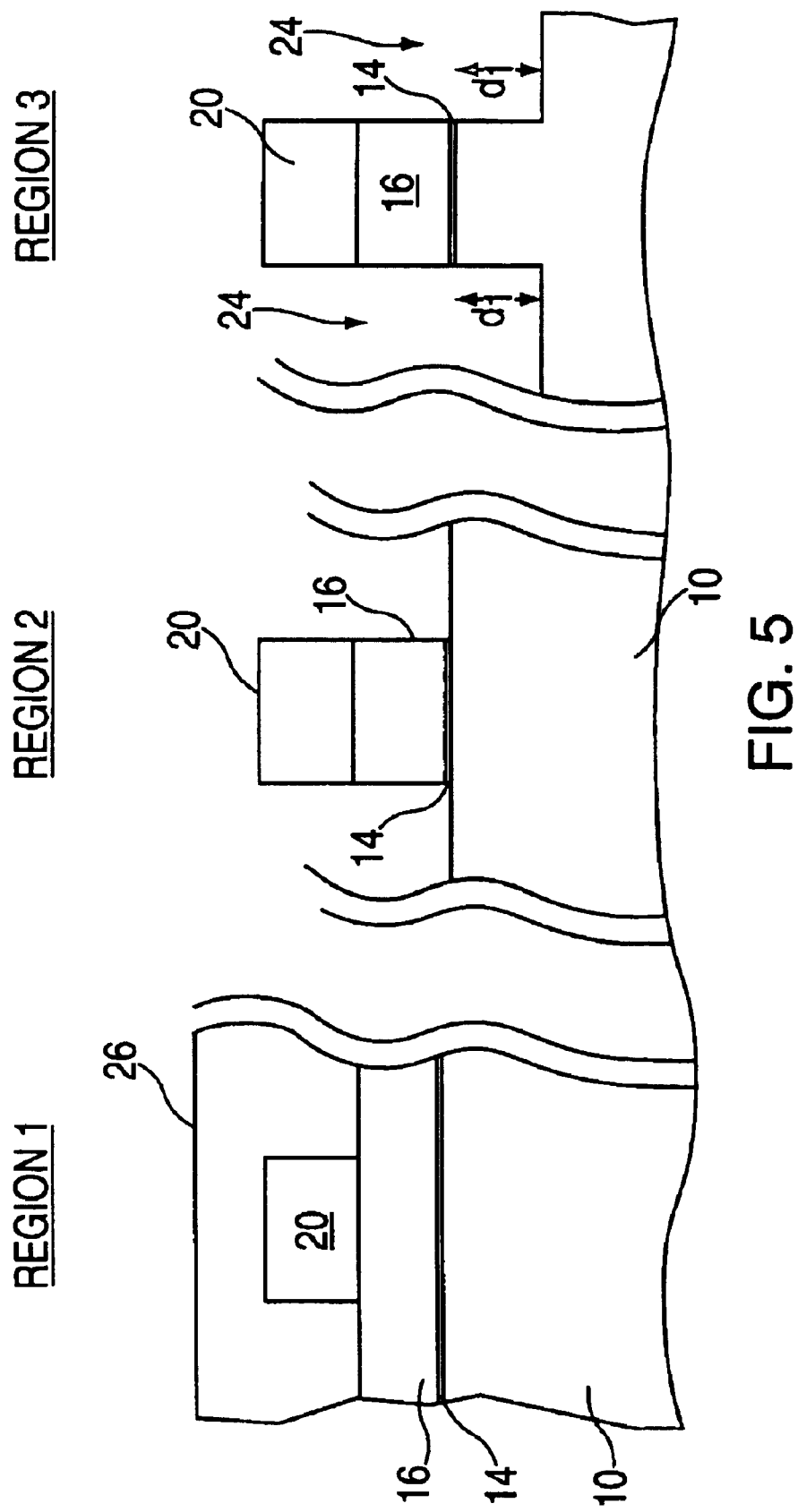
Figure 6:
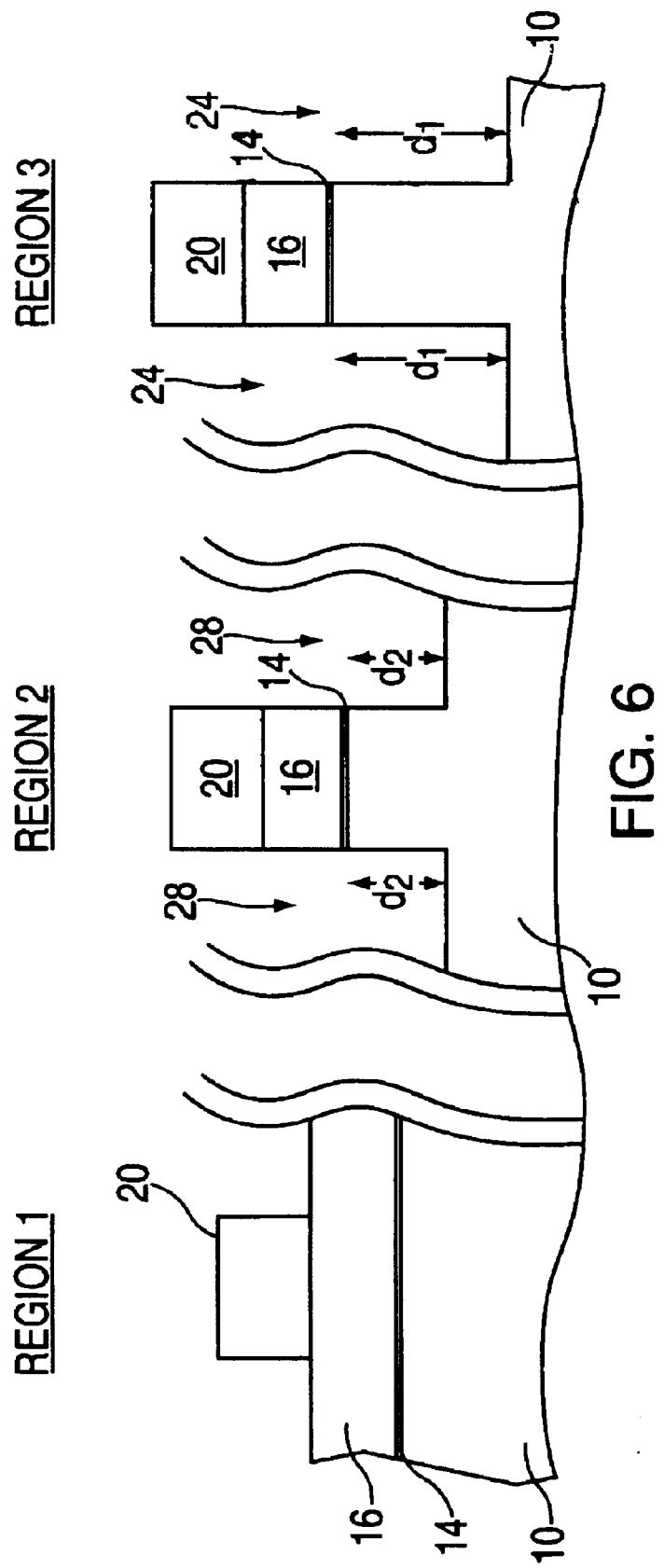

A first block mask, such as a photoresist, 22 is then applied and patterned such that the region to receive the deepest apertures, i.e., REGION 3, is exposed. Using patterned masking layer 20 as a hardmask, unprotected portions of pad nitride layer 16 and pad oxide layer 14 in REGION 3 are removed using a dry etching process such as RIE that is selective to the semiconductor substrate. The resultant structure formed after conducting the above steps is shown in FIG. 3. Note that a portion of the semiconductor substrate in REGION 3 is exposed after unprotected portions of pad nitride layer 16 and pad oxide layer 14 are removed from the structure.

Using the patterned masking layer 20 in REGION 3 and block mask 22 protecting REGIONS 1 and 2, exposed portions of semiconductor substrate 10 in REGION 3 are removed to form a plurality of first apertures 24 in the substrate that have a first depth $d_1$ associated therewith. Specifically, the first apertures are formed utilizing an etching process such as RIE, ion beam etching, plasma etching or laser ablation that is highly selective in removing portions of semiconductor substrate 10 that are not protected by patterned masking layer 20 and first block mask 22. It should be noted that the above-mentioned etching processes are also applicable for forming apertures in the other substrates mentioned above. First block 22 is then removed using a conventional stripping process well known to those skilled in the art so as to provide the structure shown in FIG. 4.

A second block mask, such as another photoresist, 26 is then applied and patterned such that REGION 1 is protected and REGIONS 2 and 3 are exposed. The exposed pad nitride in REGION 2 is then subjected to an etching process such as RIE, stopping atop pad oxide layer 14. The exposed pad oxide layer in REGION 2 is then removed utilizing a short etching process that does not remove a significant amount of patterned masking layer 20 from REGIONS 2 and 3. The resultant structure formed after these steps are performed is shown, for example, in FIG. 5. Note that a portion of semiconductor substrate 10 is now exposed in REGION 2.

The exposed semiconductor substrate in REGION 2 is etched so as to form a plurality of second apertures 28 having a second depth $d_2$ in REGION 2, while simultaneously increasing $d_1$ in REGION 3. Note that after the above etching step $d_1$ has a depth that is greater than $d_2$. Second block mask 26 is then removed from the structure using a conventional stripping process so as to form the structure shown in FIG. 6. In some embodiments of the present invention, the inventive method may end here.

Figure 7:
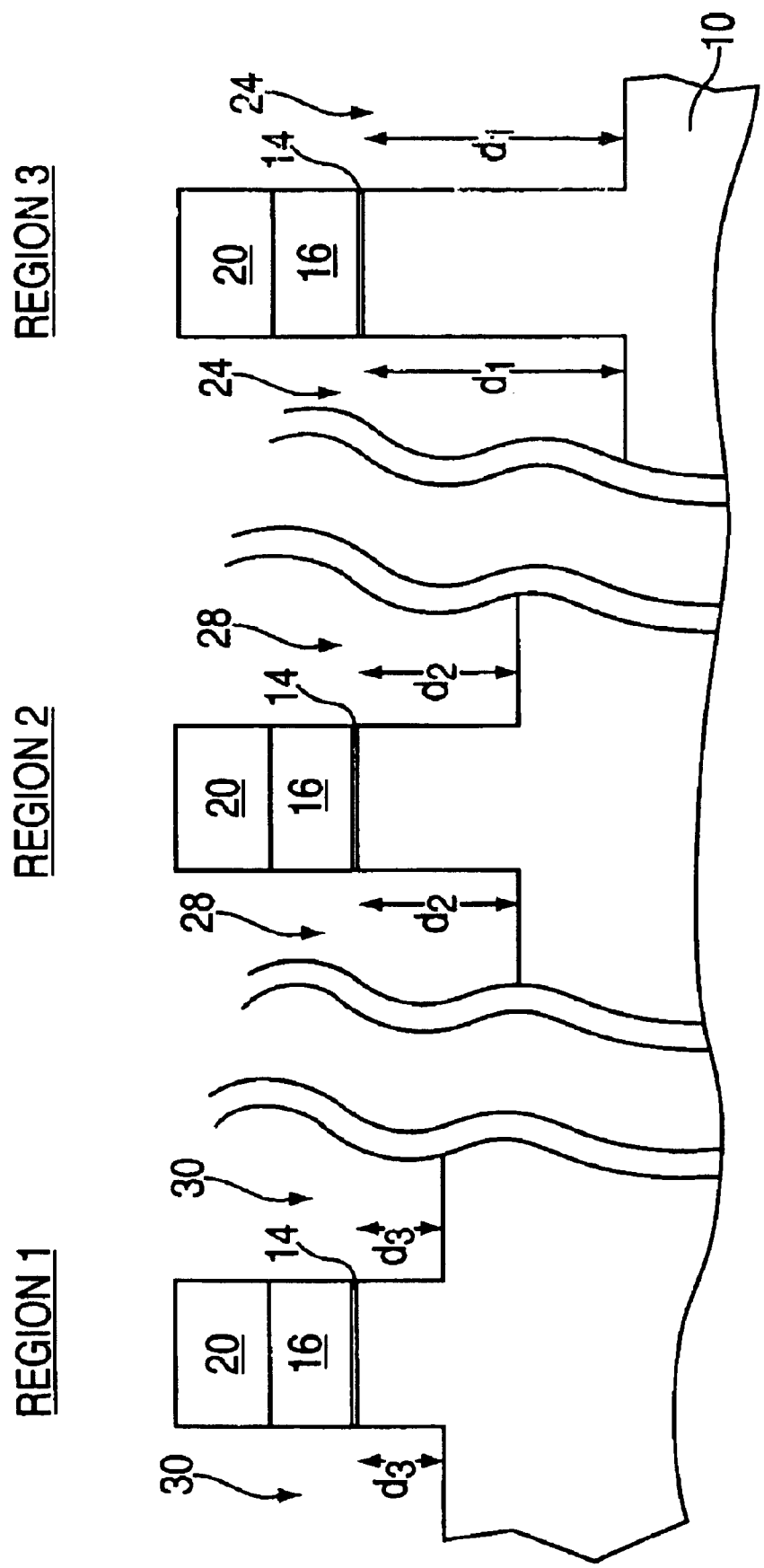
Figure 8:
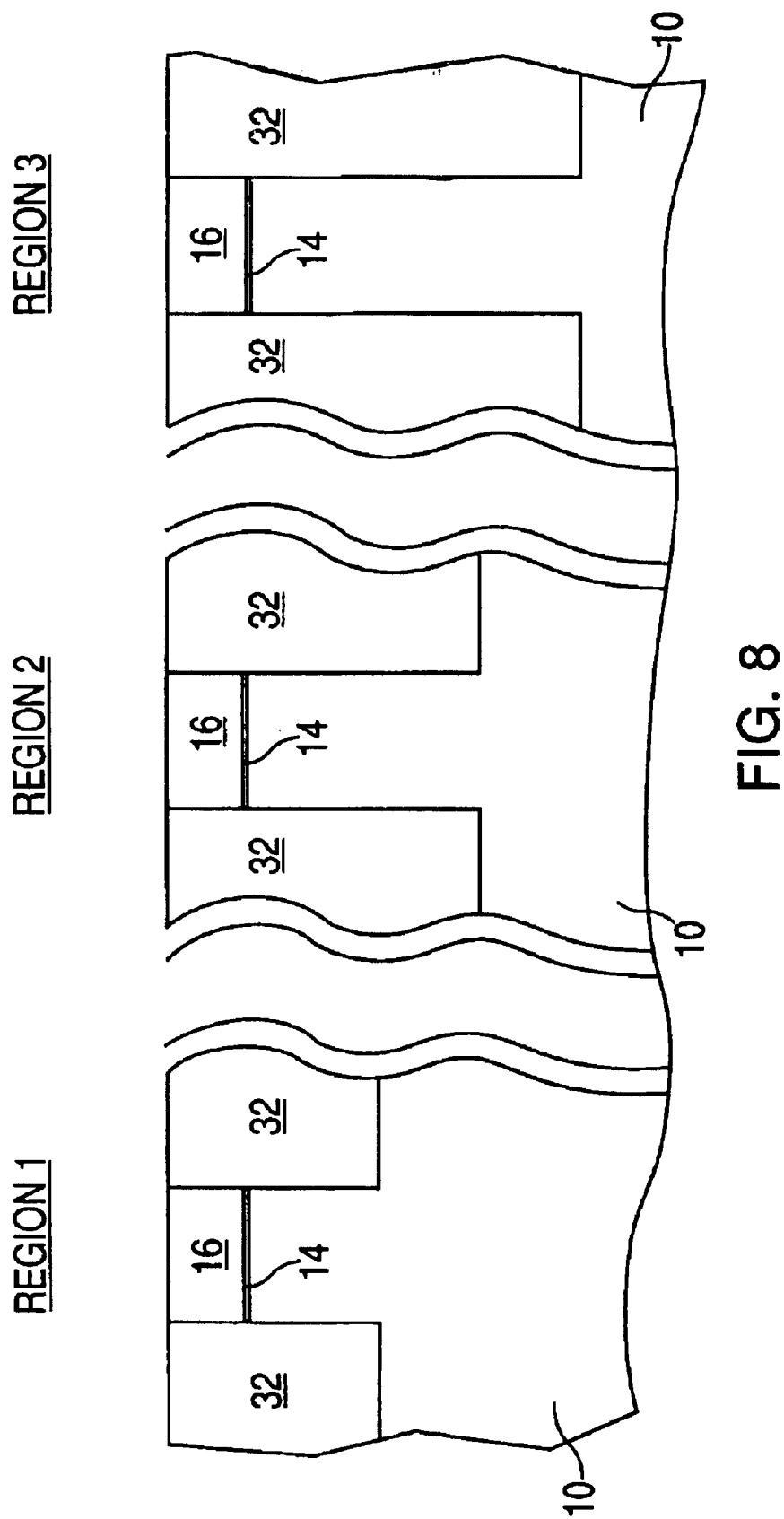

In other embodiments and as shown in FIG. 7 further processing is carried out to form additional sets of apertures in the structure. For example, the remaining pad layers in REGION 1 that are not protected by patterned masking layer 20 are removed utilizing etching processes as described above. The exposed semiconductor substrate in REGION 1 is then etched as described above to form a plurality of third apertures 30 to a third depth $d_3$, while simultaneously increasing the depth of $d_2$ and $d_1$. The resultant structure, wherein $d_1 > d_2 > d_3$, is shown in FIG. 7. Note that in the illustrated embodiment, the resulting structure contains three distinct regions, with each region containing a plurality of apertures of a predetermined depth. The depth of the apertures in each region is independent of the apertures in the other regions.

Following the formation of apertures in the structure, the apertures are then filled with trench insulating material 32, such as high-plasma density oxide or TEOS (tetraethylorthosilicate), and planarized, stopping on remaining pad nitride layer 16. Prior to filling of the apertures, a liner material may be formed in each aperture. In some embodiments of the present invention, the aperture-fill material may be subjected to a conventional densification process. Conventional processing well known to those skilled in the art continues to completion of a semiconductor chip.

While the invention has been particularly shown and described with respect to preferred embodiments thereof, it will be understood by those skilled in the art that the foregoing and other changes in form and detail may be made without departing from the spirit and scope of the present invention. It is therefore intended that the present invention is not limited to the exact forms and details described and illustrated, but fall within the spirit and scope of the appended claims.

What is claimed is:

1. A method for forming multi-depth apertures in a substrate comprising the steps of:
   (a) providing a pad stack atop a surface of a substrate having regions for forming apertures therein, said pad stack including at least a top patterned masking layer that exposes portions of said pad stack, said top patterned masking layer serving as the single critical mask used in defining apertures in said substrate;
   (b) blocking at least one of said regions of said substrate with a first block mask, while leaving at least one other region of said substrate unblocked;
   (c) forming a plurality of first apertures having a first depth in said unblocked region of said substrate using said patterned masking layer to define said plurality of first apertures by first removing said exposed portions of said pad stack to expose portions of said substrate abutting said patterned masking layer and then removing said exposed portion of said substrate, said first apertures having sidewalls that are aligned to outer edges of the top patterned masking layer;
   (d) removing said first block mask; and
   (e) forming a plurality of second apertures having a second depth in regions of said substrate that were previously blocked by said first block mask using said patterned masking layer to define said second apertures, while simultaneously increasing said first depth such that said first depth is deeper than said second depth, said second apertures having sidewalls that are aligned to outer edges of the top patterned masking layer which are formed by first removing said exposed portions of said pad stack to expose portions of said substrate abutting said patterned masking layer and then removing said exposed portion of said substrate.

2. The method of claim 1 wherein said substrate is a semiconductor substrate, a conductor, an insulator or mixtures and multilayers thereof.

3. The method of claim 1 wherein said pad stack further includes a pad oxide layer and a pad nitride layer, wherein said pad nitride layer is formed atop said pad oxide layer.

4. The method of claim 1 wherein said patterned masking layer is a silicate glass selected from the group consisting of boron doped phosphorus silicate glass and tetraethylorthosilicate.

5. The method of claim 1 wherein said patterned masking layer is formed by deposition, lithography and etching.

6. The method of claim 1 wherein said first block mask includes a first photoresist layer.

7. The method of claim 1 wherein said plurality of first apertures and said plurality of second apertures comprise openings, trenches, grooves, notches, holes, slits, gaps, slots, clefts, vias, voids, passages or mixtures thereof.

8. The method of claim 1 wherein said plurality of first apertures and said plurality of second apertures are formed by etching.

9. The method of claim 1 wherein said etching comprises reactive-ion etching.

10. The method of claim 1 further comprising blocking additional portions of said substrate with a second block mask prior to conducting step (e); conducting step (e); removing said second block mask; and forming a plurality of third apertures having a third depth, while simultaneously increasing the first and second depths such that the first depth is greater than the second depth, which is greater than the third depth.

11. The method of claim 10 further comprising the steps of repeating blocking and forming a plurality of apertures in each previously blocked region such that different sets of apertures are formed in said substrate, each set having different depths associated therewith.

12. A method of forming multi-depth isolation regions in a semiconductor substrate comprising the steps of:

(a) providing a pad stack atop a surface of a semiconductor substrate having regions for forming trench isolation regions therein, said pad stack including at least a top patterned masking layer that exposes portions of said pad stack, said top patterned masking layer serving as the single critical mask used in defining trenches in said substrate;

(b) blocking at least one of said regions of said semiconductor substrate with a first block mask, while leaving at least one other region of said semiconductor substrate unblocked;

(c) forming a plurality of first trench isolation regions having a first depth in said unblocked region of said semiconductor substrate using said patterned masking layer to define said plurality of first trench isolation regions by first removing said exposed portions of said pad stack to expose portions of said substrate abutting said patterned masking layer and then removing said exposed portion of said substrate, said first trench isolation regions having sidewalls that are aligned to outer edges of the top patterned masking layer;

(d) removing said first block mask; and (e) forming a plurality of second trench isolation regions having a second depth in regions of said semiconductor substrate that were previously blocked by said first block mask using said patterned masking layer to define said second trench isolation regions, while simultaneously increasing said first depth such that said first depth is deeper than said second depth, said second trench isolation regions having sidewalls that are aligned to outer edges of the top patterned masking layer which are formed by first removing said exposed portions of said pad stack to expose portions of said substrate abutting said patterned masking layer and then removing said exposed portion of said substrate.

13. The method of claim 12 wherein said semiconductor substrate is selected from the group consisting of Si, Ge, SiGe, GaAs, InAs, InP, Si/SiGe and silicon-on-insulator.

14. The method of claim 12 wherein said pad stack further includes a pad oxide layer and a pad nitride layer, wherein said pad nitride layer is formed atop said pad oxide layer.

15. The method of claim 12 wherein said patterned masking layer is boron doped phosphorus silicate glass.

16. The method of claim 12 wherein said patterned masking layer is formed by deposition, lithography and etching.

17. The method of claim 12 wherein said plurality of first apertures and said plurality of second apertures are formed by reactive-ion etching.

18. The method of claim 12 further comprising blocking additional portions of said substrate with a second block mask prior to conducting step (e); conducting step (e); removing said second block mask; and forming a plurality of third trench isolation regions having a third depth, while simultaneously increasing the first and second depths such that the first depth is greater than the second depth, which is greater than the third depth.

19. The method of claim 18 further comprising the steps of repeating blocking and forming a plurality of isolation trench regions in each previously blocked region such that different sets of trench isolation regions are formed in said substrate, each set having different depths associated therewith.

20. The method of claim 12 further comprising depositing a trench isolation material in each of said trench isolation regions and planarizing.

* * * * *